US008878164B2

(12) United States Patent
Gather et al.

(10) Patent No.: US 8,878,164 B2
(45) Date of Patent: Nov. 4, 2014

(54) ORGANIC LIGHT-EMITTING DIODE HAVING OPTICAL RESONATOR

(75) Inventors: Malte Gather, Aachen (DE); Klaus Meerholz, Rösrath (DE)

(73) Assignee: Universitaet zu Koeln, Köln (DE)

( * ) Notice: Subject to any disclaimer, the term of this patent is extended or adjusted under 35 U.S.C. 154(b) by 1 day.

(21) Appl. No.: 13/133,298

(22) PCT Filed: Oct. 14, 2009

(86) PCT No.: PCT/EP2009/063422
§ 371 (c)(1),
(2), (4) Date: Aug. 26, 2011

(87) PCT Pub. No.: WO2010/066488
PCT Pub. Date: Jun. 17, 2010

(65) Prior Publication Data
US 2011/0303905 A1 Dec. 15, 2011

(30) Foreign Application Priority Data

Dec. 9, 2008 (DE) .......................... 10 2008 054 435

(51) Int. Cl.
| *H01L 29/08* | (2006.01) |
| *H01L 35/24* | (2006.01) |
| *H01L 51/00* | (2006.01) |
| *H01L 51/52* | (2006.01) |

(52) U.S. Cl.
CPC ......... *H01L 51/5265* (2013.01); *H01L 51/0018* (2013.01)
USPC .............. 257/40; 257/E51.018; 257/E51.019; 257/E51.021; 257/E51.022; 257/E51.026

(58) Field of Classification Search
USPC ............. 257/40, E51.018, E51.019, E51.021, 257/E51.022, E51.026
See application file for complete search history.

(56) References Cited

U.S. PATENT DOCUMENTS

| 4,432,091 A | * | 2/1984 | Kuroda et al. | ............. 372/45.01 |
| 4,845,043 A | * | 7/1989 | Catalano | .......................... 438/93 |

(Continued)

FOREIGN PATENT DOCUMENTS

| JP | 2002208481 A | 7/2002 |
| JP | 2002212150 A | 7/2002 |

(Continued)

*Primary Examiner* — Ida M Soward
(74) *Attorney, Agent, or Firm* — Dilworth & Barrese, LLP.

(57) ABSTRACT

The invention relates to an organic light-emitting diode, known under the abbreviation OLED, and to a method for the production of such an organic light-emitting diode. According to the invention, an OLED or organic light-emitting diode having an emitter layer (5) is produced, said emitter layer emitting white light in particular. The emitter layer (5) is arranged within a lossy, optical resonator. The optical path length between the two reflecting layers of the resonator determines the color of the light emitting from the optical resonator and, consequently, from the light-emitting diode. In order to be able to create a variety of colors, there must be different optical path lengths between the two reflecting surfaces. The correspondingly different distances can be produced in only one work step, in contrast to the prior art, by a photolithographic method. The result is an organic light-emitting diode having a lossy optical resonator, having an emitter layer (5) and a layer (4) that can be photolithographically structured. Said layer (4) is comprised of photochemically curable materials. Organic light-emitting diodes according to the invention can be used in light sources, lighting, sensors or spectrometers.

17 Claims, 6 Drawing Sheets

(56) References Cited

U.S. PATENT DOCUMENTS

| | | | |
|---|---|---|---|
| 4,886,698 A * | 12/1989 | Purdy | 428/213 |
| 4,907,052 A * | 3/1990 | Takada et al. | 257/458 |
| 6,396,860 B1 * | 5/2002 | Kozlov et al. | 372/39 |
| 6,658,037 B2 * | 12/2003 | Kahen et al. | 372/70 |
| 6,665,479 B2 * | 12/2003 | Gharavi | 385/122 |
| 6,787,991 B2 * | 9/2004 | Nakayama et al. | 313/504 |
| 6,947,459 B2 * | 9/2005 | Kurtz et al. | 372/43.01 |
| 7,166,959 B2 * | 1/2007 | Suzuki et al. | 313/504 |
| 7,208,863 B2 * | 4/2007 | Strip | 313/112 |
| 7,242,703 B2 * | 7/2007 | Forrest et al. | 372/39 |
| 7,323,634 B2 * | 1/2008 | Speakman | 136/256 |
| 7,454,103 B2 * | 11/2008 | Parriaux | 385/37 |
| 7,518,141 B2 * | 4/2009 | Nakamura | 257/40 |
| 7,536,070 B2 * | 5/2009 | Rosa de Almeida et al. | 385/31 |
| 7,719,499 B2 | 5/2010 | Yu et al. | |
| 7,738,522 B2 * | 6/2010 | Henrichs | 372/43.01 |
| 8,102,111 B2 * | 1/2012 | Maeda et al. | 313/503 |
| 8,237,360 B2 | 8/2012 | Kinoshita | 313/506 |
| 8,243,770 B2 * | 8/2012 | El-Ghoroury et al. | 372/50.121 |
| 8,278,817 B2 * | 10/2012 | Kimura et al. | 313/503 |
| 8,449,125 B2 * | 5/2013 | Tischler et al. | 359/614 |
| 8,462,084 B2 | 6/2013 | Asaki et al. | |
| 8,471,456 B2 * | 6/2013 | Bechtel et al. | 313/501 |
| 2004/0069995 A1 * | 4/2004 | Magno et al. | 257/80 |
| 2004/0101008 A1 * | 5/2004 | Kurtz et al. | 372/39 |
| 2004/0108806 A1 * | 6/2004 | Cok et al. | 313/504 |
| 2005/0142976 A1 * | 6/2005 | Suzuki | 445/24 |
| 2005/0248830 A1 * | 11/2005 | Sawin et al. | 359/321 |
| 2007/0159086 A1 | 7/2007 | Yu et al. | |
| 2008/0074037 A1 | 3/2008 | Fukase et al. | |
| 2008/0197371 A1 | 8/2008 | Ottermann | |
| 2009/0001397 A1 * | 1/2009 | Fine et al. | 257/98 |
| 2009/0015141 A1 * | 1/2009 | Wang et al. | 313/504 |
| 2011/0037379 A1 * | 2/2011 | Lecamp et al. | 313/503 |

FOREIGN PATENT DOCUMENTS

| | | |
|---|---|---|
| JP | 2002246178 A | 8/2002 |
| JP | 2004199935 A | 7/2004 |
| JP | 2008098046 A | 4/2008 |
| WO | 201210129 A | 2/2002 |
| WO | 2006/087658 | 8/2006 |

* cited by examiner

ORGANIC LIGHT-EMITTING DIODE HAVING OPTICAL RESONATOR

BACKGROUND OF THE INVENTION

The invention relates to organic light-emitting diodes, known under the abbreviation OLED, and to a production method of such organic light-emitting diodes.

An organic light-emitting diode is a luminescent component consisting of organic semiconductors. Organic light-emitting diodes consist of one or several thin organic layers which are arranged between electrically conductive electrodes.

An organic light-emitting diode comprises an anode which may, for example, be mounted on a glass plate and which e.g. consists of indium-tin-oxide (ITO) and is transparent within the visible range. Generally a hole transport layer is located above the anode. This hole transport layer may, for example, consist of PEDOT/PSS (poly(3,4-ethylenedioxy thiophene)/polystyrene sulfonate) which is employed for lowering the injection barrier for the holes and as a diffusion barrier for indium. An emitter layer is provided on the hole transport layer, either containing a dye (approx. 5-10%) or entirely consisting of the dye (e.g. aluminum-tris(8-hydroyquinoline), $Alq_3$). An electron transport layer is generally mounted hereon. Finally a cathode with a low electron work function consisting of a metal or an alloy such as e.g. calcium, aluminum, barium, ruthenium, magnesium-silver alloy is for example vapor-deposited under full vacuum. In order to lower the injection barrier for electrons, the cathode will routinely be vapor-deposited as a double layer consisting of a very thin layer of lithium fluoride, cesium fluoride, calcium or barium and a thicker layer of aluminum or silver.

From EP 1083612 A2, cathode layers having a multi-layer structure such as lithium fluoride/calcium/aluminum or barium/silver are known as organic light-emitting diodes. The function of lithium, calcium and barium fluorides, respectively, is to inject electrons into the layer positioned underneath. The thickness of the lithium fluoride layer amounts to a few nanometers. The thickness of the barium and the calcium layers, respectively, may be up to 100 nm. The function of the aluminum or silver layer is to transport the major part of charges from the cathode connector to the light-emitting element that is to the light-emitting layer. The thickness of this layer is in the range of 0.1 to 2 µm. In this arrangement, the layer consisting of lithium fluoride, calcium or barium constitutes the so-called electron injection layer while the aluminum/silver layer will constitute the electrically conductive layer of the cathode. In addition, the aluminum and the silver layers, respectively, protect the still delicate and reactive electron injection layer.

The electrons, i.e. the negative charges, are injected by the cathode while the anode provides holes and defect electrons, respectively, that is the positive charges. Due to an applied electrical field positive and negative charges migrate towards each other and ideally meet within the emitter layer, and that is why this layer is also called recombination layer. By recombination of an electron and a hole in the emitter layer a so-called exciton will be formed. Depending on the mechanism, the exciton either already constitutes the excited state of the dye molecule or the energy of the exciton will be passed to the dye molecule in a transfer process. The dye has several excited states. The excited state may return into ground state while emitting a photon (light particle) during the process. The color of the emitted light depends on the energy gap between excited and ground state and can specifically be changed by means of variation or chemical modification of the dye molecules.

Organic light-emitting diodes are mainly used in displays for computers, TV sets, MP3 players, etc., or as light sources in illumination applications. OLEDs are also increasingly considered as an option for light sources in sensor technology applications.

If organic light-emitting diodes are to be applied in full color displays it is required that at least three basic colors can be generated independently controlled of each other. The display then comprises a multitude of single pixels and organic light-emitting diodes, respectively, capable of emitting light of different colors, wherein the generation of light by each pixel can be electronically controlled.

In the case that an organic light-emitting diode is to be used as a light source for illumination an electronic control of single pixels is not required. Although a light source may also comprise a multitude of pixels or organic light-emitting diodes, respectively, which can generate different light colors this distribution merely is to allow generating the desired light color, such as, for example, white light, by having the pixels emit the three basic colors red, green and blue in a suitably distributed manner.

If organic light-emitting diodes are to be applied in sensor technology it depends on the respective application whether separately controllable pixels emitting different colors are required or not. Due to the spectrally wide emission—in comparison to other light sources used in sensor technology (e.g. LEDs)—of most organic light-emitting diodes known from the state of the art, the use of pixels emitting different colors has generally not been feasible in a suitable manner in prior art.

It is known from the state of the art that the single pixels of a display or a light source based on organic light-emitting diodes can be produced under full vacuum by thermal evaporation of small molecules emitting different colors. In said at least three step process red-, green- and blue-emitting small molecules are for example successively applied to the substrate by means of shadow masks. In this process basically only small molecules and no polymers will be deposited since polymers are too large for thermal evaporation.

A typical small molecule which is deposited by thermal evaporation is the metal complex $Alq_3$. $Alq_3$ is able to emit green light. By adding dyes the emission color of $Alq_3$ can be changed. Additionally, other metal complexes or other small molecules may also be used in order to generate other colors which cannot be achieved with $Alq_3$ or modified $Alq_3$.

Thermal evaporation is preferred since there is no need to use solvents although employing such a process is of high cost. If a solvent is used the risk of contaminating the material will exist compromising efficiency of an organic light-emitting diode and duration of life thereof.

A shadow mask which is used for the disclosed structure resembles a grid. The holes of the shadow mask are located in places which the respective molecule is to reach on a substrate located underneath. After a first deposition of first molecules through the holes of the shadow mask the shadow mask is moved in a suitable manner or replaced by a second shadow mask and second molecules which emit another light color are deposited onto the substrate positioned underneath through the holes of the shadow mask. In the same manner, third molecules will be deposited in a third step.

Proper alignment of the shadow masks in relation to each other and in relation to the substrate has proven to be difficult since alignment precisions in the order of 1 to 10 µm are required over large surfaces [Stephen R. Forrest, Nature 428, p. 911-918 (2004)]. An additional problem is that during deposition the molecules are not only deposited on the substrate but also, disadvantageously, on the shadow mask. This deposition causes a change of the holes in the shadow mask and thus will lead to a change of depositions on the substrate. Furthermore, the deposited substances may detach from the shadow mask resulting in dust formation. Dust formation will disadvantageously affect the manufacture of organic light-emitting diodes.

From the document "Solution-Processed Full-Color Polymer Organic Light-Emitting Diode Displays Fabricated by Direct Photolithography" by Malte C. Gather, Anne Kohnen et al. in Advanced Functional Materials, 2007, 17, 191-200, an alternative photolithographic method is known for the manufacture of organic various color light-emitting diodes in in the form of pixels of a display, as described herein. The emitting materials—in this case electroluminescent polymers—are deposited from a solution, so that the costly step of thermal evaporation under full vacuum can be omitted. However, here again, three consecutive alignment steps are required to produce pixels emitting red, green and blue.

In order to avoid the complicated alignment process it has been suggested to use a blend of material or a multiple layer design which emits white light, and to use it for all subpixels instead of structured deposition of small molecules or polymers emitting various colors. Suitable blend of material/multiple layer designs may consist of polymers or small molecules such as e.g. metal complexes. In the latter case metal complexes are frequently preferred since they currently allow achieving a higher light intensity. Generally, such a blend of material and multi-layer design, respectively, comprises components which emit the three basic colors, thus ultimately emitting white light.

Color appearance is achieved by post-lamination of a matrix of color filters. Such a matrix or color filter array, respectively, is made of pigmented photoresists. In the production process a first photoresist layer is initially applied which, for example, is employed as a color filter for blue light. This photoresist layer will be exposed to light in the respective areas and will thus be rendered insoluble. The remaining unexposed areas are rinsed off. Subsequently, an additional photoresist is applied which forms another color filter. Thus, in at least three steps the desired matrix of color filters is obtained. Such state of the art can, for example, be found in the document "I Underwood et al., SID 04 Digest, p. 293-295 (2004)" and "B. J. Green, Displays 10(3), p. 181-184 (1989)".

However the alignment problem will only be delayed in the process chain as the color filters and the color filter array, respectively, must exactly be adjusted in relation to the subpixel structure. Additionally color saturation and performance which are achieved using this method will not be sufficient for many applications.

From the document US 2007/0286944 A1 an organic light-emitting diode is known which comprises a lossy optical resonator. A layer system consisting of a hole injection layer, a hole transport layer, an emitting layer, and an electron transport layer is located between a completely reflective cathode layer and a partially reflective anode layer. The light color which is generated by this organic light-emitting diode is adjusted by means of distance between the two reflective electrode layers. In order to generate different light colors the thickness of the hole injection layer is varied. The various layers are applied by vapor deposition. In order to adjust the thickness of the hole injection layer, small molecules are vapor-deposited in different thicknesses. In order to produce three different defined layer thicknesses it is necessary to use and suitably align shadow masks in the vapor coating process.

Therefore, this state of the art has the disadvantages already mentioned above, i.e. there will be the necessity to perform several complicated alignments of the mask.

The document U.S. Pat. No. 6,091,197 also discloses an organic light-emitting diode having a lossy optical resonator wherein a layer capable of generating white light is arranged. The distance between the two reflective layers of the optical resonator defines the color of the light emanating from the organic light-emitting diode. This distance can be varied by means of an electromechanical control in order to change the light color of the organic light-emitting diode. Although the state of the art known from the document U.S. Pat. No. 6,091,197 is suitable to produce a light source which can be adjusted to a desired light color which can be changed at any time, the invention known therefrom is not suitable for other applications. For example the device is not suited for the use as a display because an electrical field has to be permanently applied in order to maintain a desired emission color. The manufacture and alignment of the flexible membrane is quite elaborate, such that neither generation of a cost efficient white light source, a light source for sensor applications emitting light in various colors, nor a spectrometer, are feasible by the use of this device.

From the document DE 100 37 391 A1 cross-linkable organic materials are known which are to be used in organic light-emitting diodes.

SUMMARY OF THE INVENTION

It is the object of the invention to provide an organic light-emitting diode which is easier to manufacture.

In the present invention, an OLED and organic light-emitting diode, respectively, is produced with an emitter layer especially emitting white light. The emitter layer is located within a lossy optical resonator. An optical resonator is an arrangement of two reflective mirror layers for the reflection of light both back and forth. A standing wave forms in the resonator when the optical path length of the resonator is a multiple of the wave length of the emitted light. In contrast to a lossless resonator a light beam is able to escape from the assembly after a few reflections in a lossy resonator. One reflective layer of the resonator is only partly reflective and is furthermore partly penetrable to light so that light is coupled out via this partly reflective mirror layer. The other reflective layer of the lossy optical resonator preferably reflects light completely in order to achieve high efficiencies.

The optical path length between the two reflective layers of the resonator determines the color of the light emanating from the optical resonator and thus from the light-emitting diode. The color of the light emanating from the light-emitting diode is thus adjusted by means of distances. In order to permit generating a multitude of colors various optical path lengths must be available between the two mirror layers, as can be seen, e.g., from the documents U.S. Pat. No. 6,091,197 and US 2007/0286944 A1. In contrast to the state of the art, in the present invention the respective various distances can be generated in only one step by means of a photolithographical process. The result is an organic light-emitting diode with a lossy optical resonator wherein an emitter layer and a layer which can photolithographically be structured are located. This layer consisting of photochemically crosslinkable materials has varying layer thicknesses in order to provide various optical path lengths. The layer consists of photochemically crosslinkable, electrically conductive or semiconductive materials. When exposed these electrically conductive or semiconductive negative photoresists become completely or partly insoluble. The unexposed areas remain soluble. Materials which function similarly may also be used. Thus, for example, an electrically conductive or semiconductive positive photoresist which, when exposed, becomes completely or partly soluble, may also be considered. In this case the unexposed areas thus remain insoluble.

The light color of the light emanating from the organic light-emitting diode will be defined by the formation of standing waves in the lossy optical resonator. However, if desired, due to resonator the respective desired color can be amplified such that the respective desired wave length will prevail by far. For simplicity reasons the reflective layers of the optical resonator consist of metal. Basically, other materials may also be considered, for example dielectrical layer stacks which are provided in combination with Bragg-mirrors.

A mirror layer of the optical resonator especially consists of Ag, Al, Au, or includes multiple Bragg-mirrors. In the case of Bragg reflections, generally multiple Bragg mirrors stacked onto each other are provided in order to reflect the entire light spectrum. If a reflective layer is to be partly transparent the layer thickness is dimensioned suitably thin, e.g. a layer consisting of silver, aluminum, gold, copper, titan or nickel which is 10 to 100 nm thin.

Although the emitter layer, i.e. the layer which emits light, may basically be of variable thickness and consist of a photochemically crosslinkable material, this, however, severely limits the selection of materials the emitter layer may consist of.

Therefore, in one embodiment of the invention, the organic light-emitting diode comprises an additional layer (in addition to the emitter layer) within the optical resonator, especially a hole or electron transport layer of varying thickness which consists of the photochemically crosslinkable material. Accordingly, the emitter layer may consist of a material which is not photochemically crosslinkable. Thus the material of the emitter layer may be selected from a wider variety of materials and the emitter layer may be optimized with regard to light generation in an easier way.

An emitter layer is preferably formed by an RGB copolymer. An RGB copolymer emits at least red, green and blue light. The emitter layer may be a blend of components emitting red, green and blue or a layer system comprising a layer emitting red light, a layer emitting green light, and a layer emitting blue light.

Since the layer which is structured, i.e. which is produced having variable thickness, is photochemically crosslinkable, it is possible to use photolithographical structuring. The basic principle of photolithography is for example disclosed in the document "Adams, Layton, Siahmakoun, "Lecture notes in Computer Science", Springer-Verlag (2008)". Structuring of photochemically crosslinkable semiconductors is disclosed in the document "Gather et al., Solution-Processed Full-Color Polymer Organic Light-Emitting Diode Displays Fabricated by Direct Photolithography, Advanced Functional Materials, 17, 191-200, 2007".

Contrary to the above-mentioned documents, in the present invention structuring will not be accomplished by means of a black and white shadow mask but by means of a gray-scale mask which is a mask having varying light permeability in different locations. This allows space-resolved application of variable exposure doses. The gray-scale mask may be a glass plate coated with metal layers of varying layer thicknesses. Light impacting the glass plate is absorbed at different rates. However, a PET transparency film, i.e. a sheet consisting of polyethylene terephthalate, which on its surface is blackened to different degrees thus permitting light to pass at different rates, may also be used.

Such a shadow or gray-scale mask, respectively, is placed on top of the layer which can photolithographically be structured, for example photochemically crosslinked. The exposure is subsequently performed through the shadow mask. Crosslinking of the photochemically crosslinkable layer that will be crosslinked to different extents will thereby be accomplished. This results in different layer thicknesses of the layer which has been crosslinked to different extents. In particular, crosslinking results in that the layer becomes insoluble in the crosslinked areas. The layer otherwise remains soluble. Generally after crosslinking a developing step will be performed in order to remove these parts which have not been crosslinked. In this way the desired structuring is achieved in only one process step. Multiple alignments—as previously described—may then be omitted.

If the light-emitting diode is to be used as a light source the additional layer may be electrically conductive. If the method described in the present invention is to be applied to manufacture displays variable control of the pixels must be possible. This is accomplished by the fact that the additional layer consists of a semiconductive material or a material having adequately low electrical conductivity.

In one embodiment low molecular weight crosslinkable hole conductors are provided as the material for the additional layer, such as e.g. the structure on triarylamine basis having oxetane as a reactive group shown below:

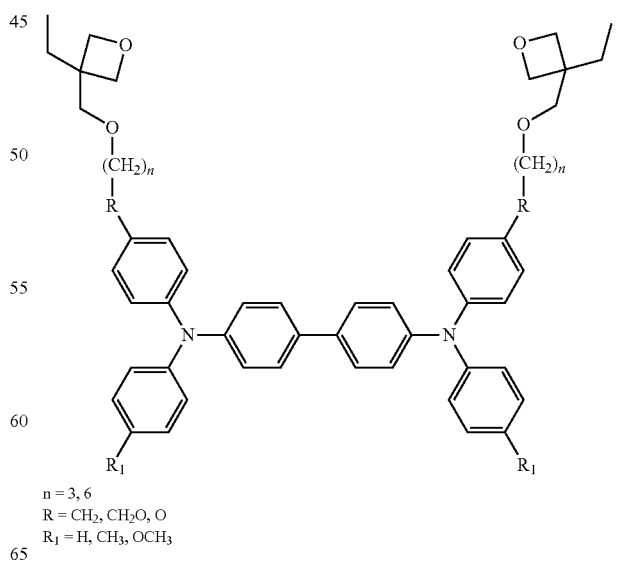

n = 3, 6
R = CH$_2$, CH$_2$O, O
R$_1$ = H, CH$_3$, OCH$_3$

Further examples for suitable materials will arise from the following structures:
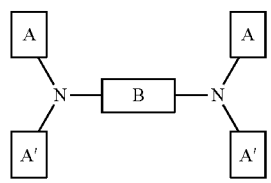
B1:
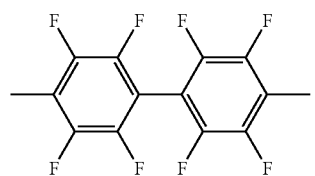
B2:
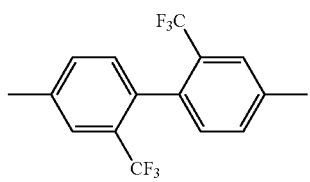
B3:
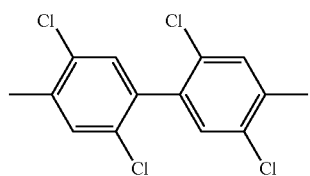
B4:
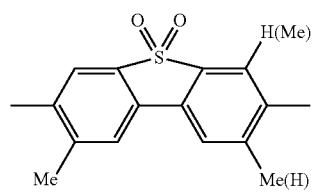
B5:
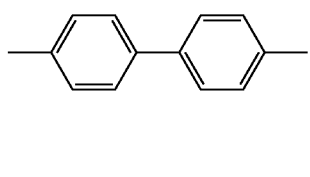
A1:
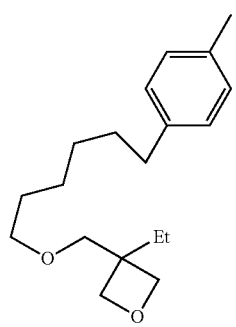
A2:
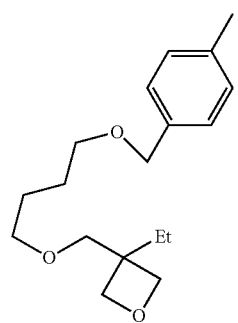
A3:
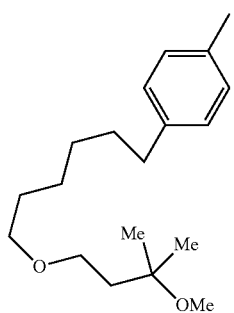
A4:
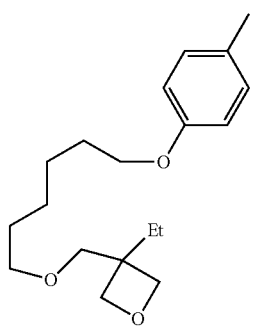
A5:
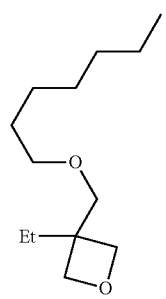
A6: X = CF$_3$
A7: X = Cl
A8: X = H
A9: X = OMe
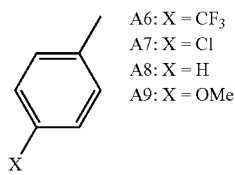
A10:
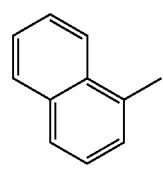

A11: 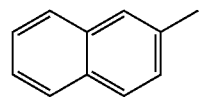
A12: 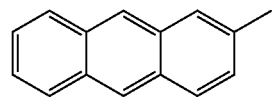
A13: 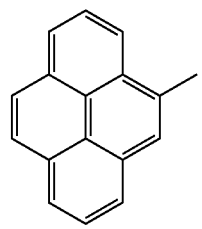
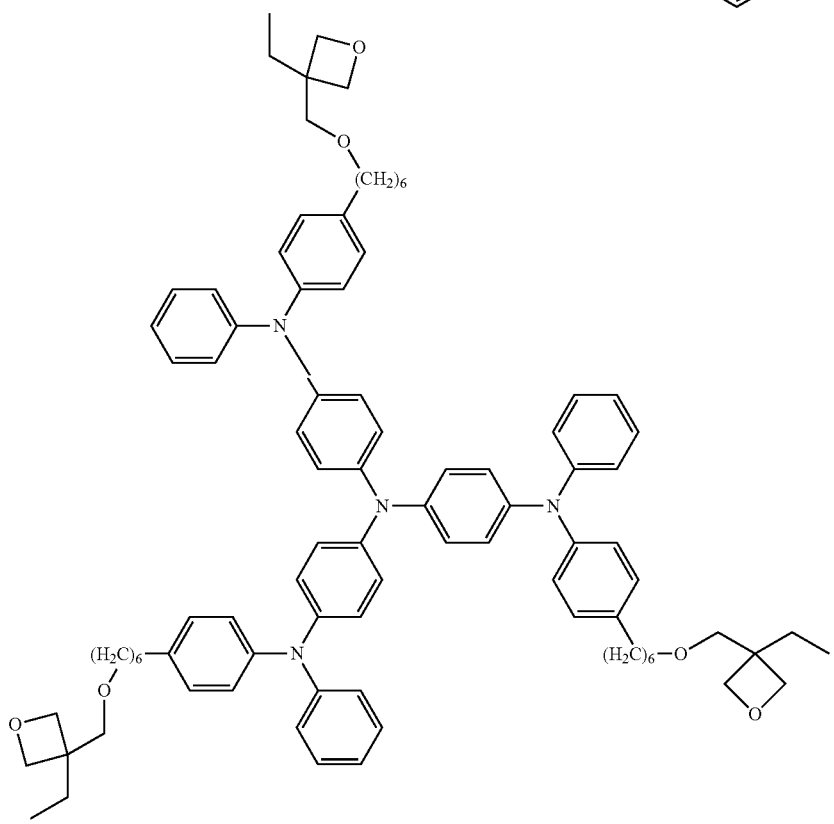
Further possible chemical structures are depicted below, which are also photochemically crosslinkable; however, they are not based on oxetanes. For example, derivatives of cinnamic acid may be used which will be cosslinked by [2+2] cycloaddition. The chemical structures of such materials are shown in the following figure:
a)
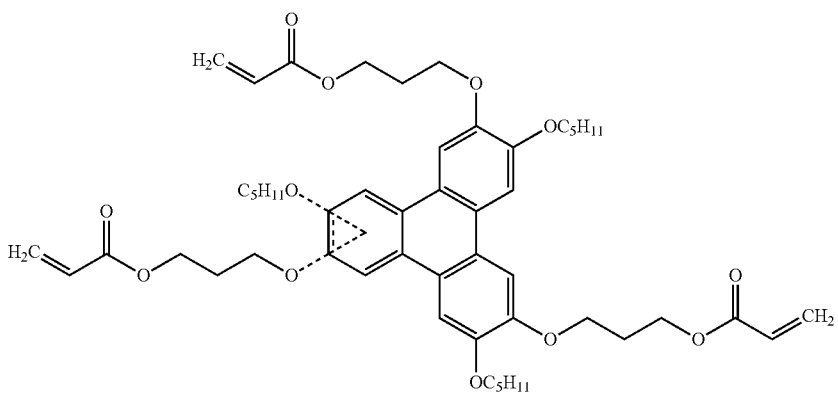

-continued
b)
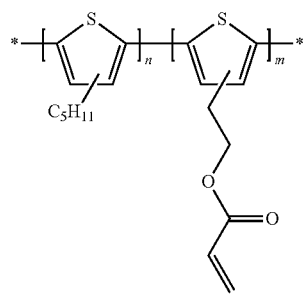
c)
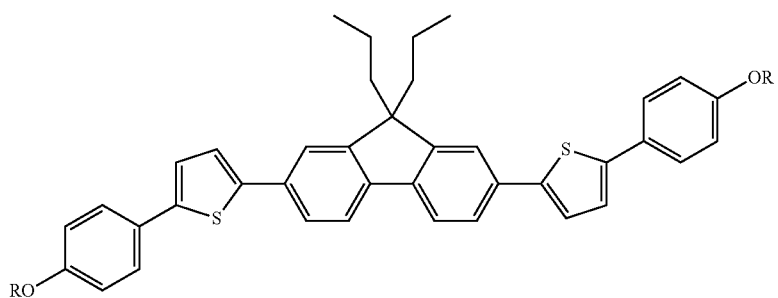
d)
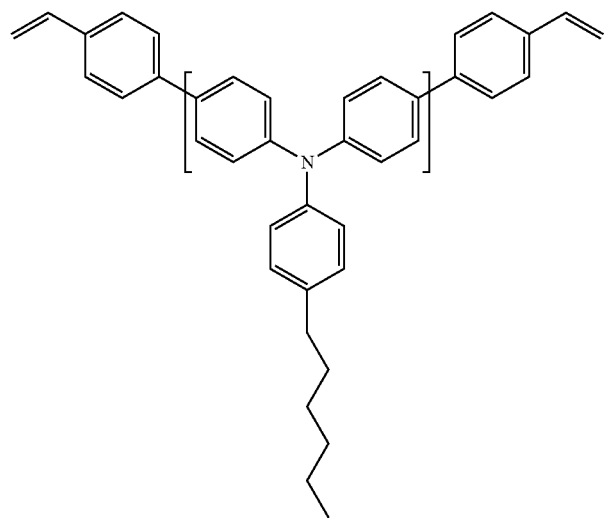

-continued
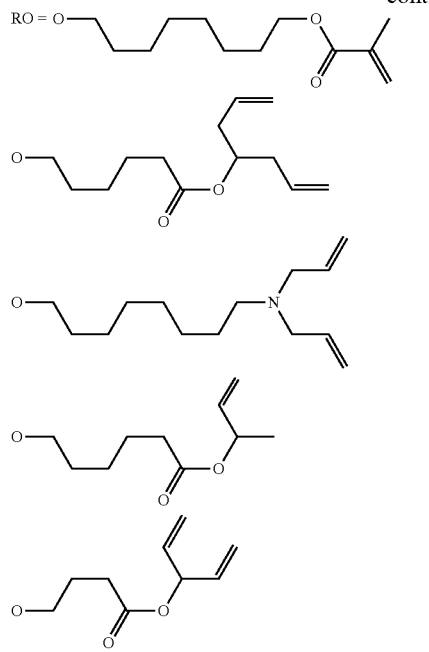
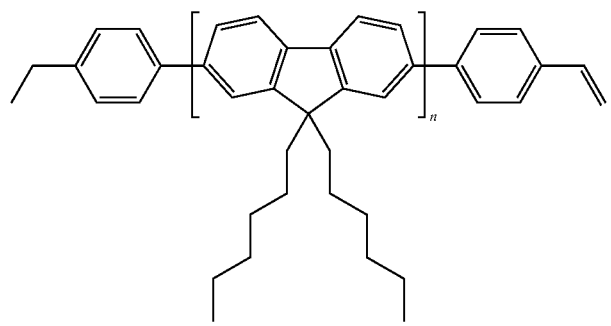
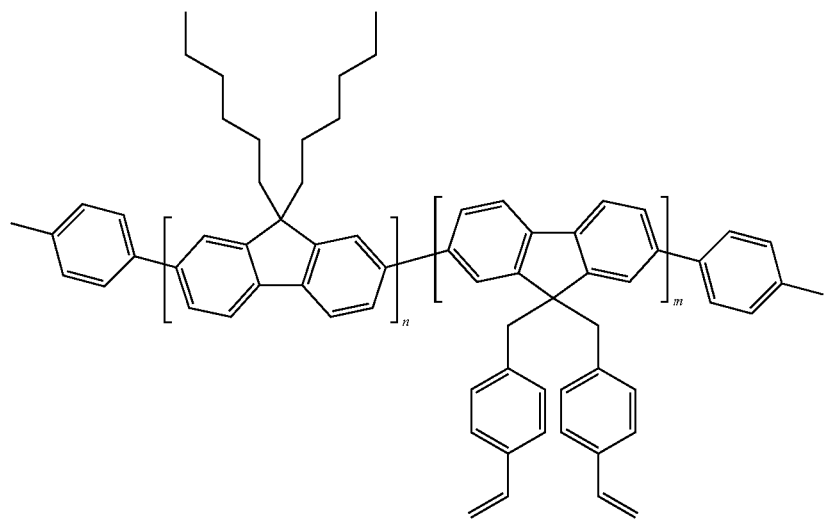
? indicates text missing or illegible when filed Additionally dienes and metacrylates may be used for photo-induced radical crosslinking. The chemical structures of such materials are shown in the following figure:
a)
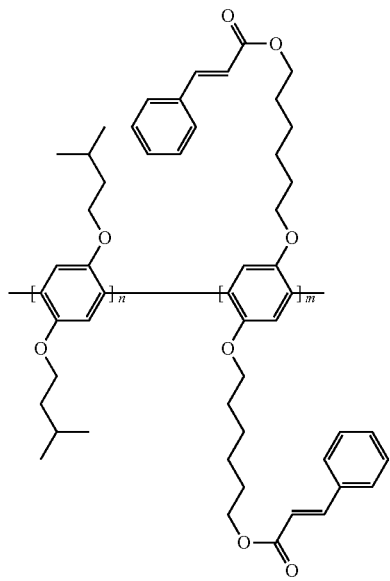
b)
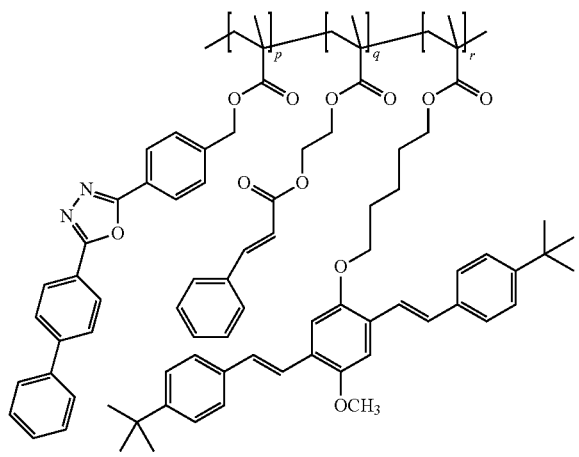
c)
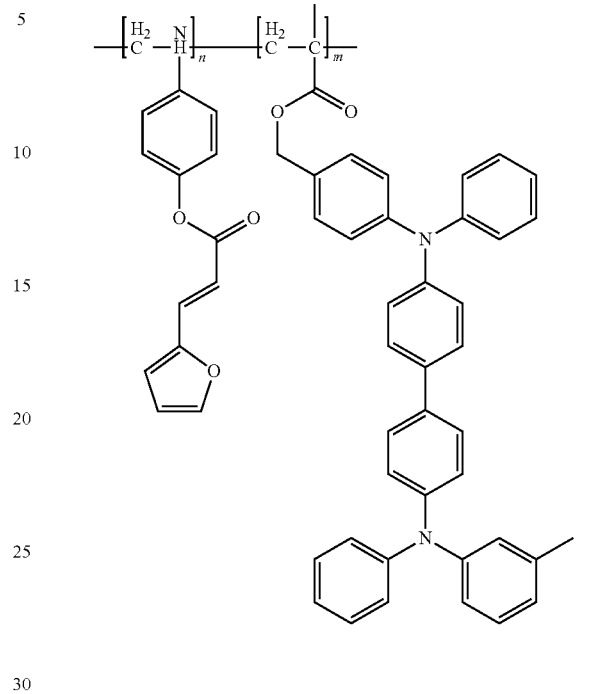
d)
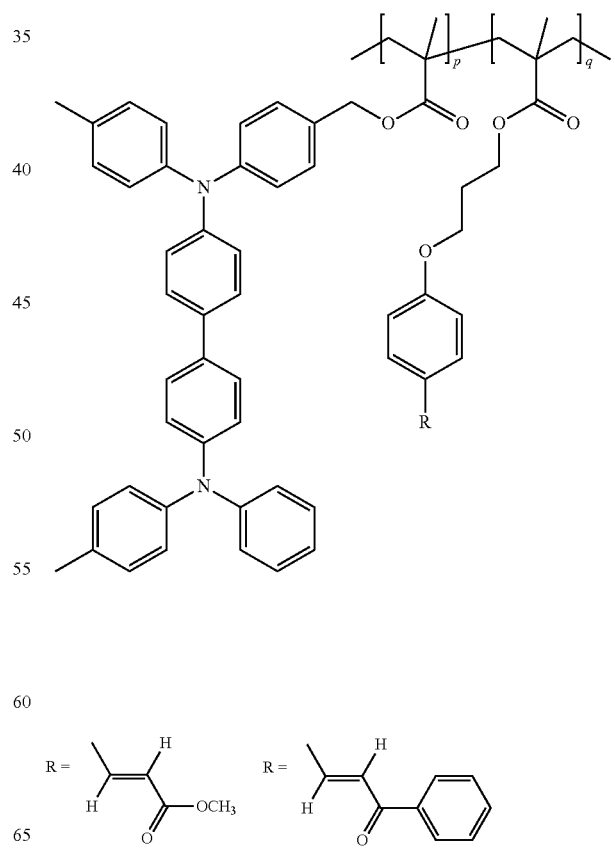

-continued e)

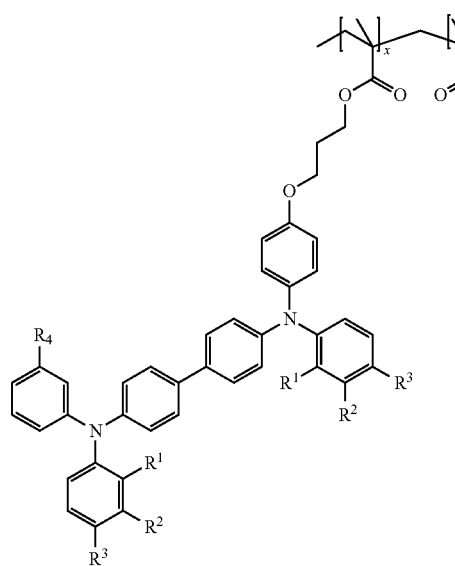

In another embodiment of the invention, crosslinkable oligomeric or polymeric hole conductor materials are provided as the material for the additional layer allowing simplifying production conditions in comparison to the use of low molecular weight crosslinkable hole conductors due to excellent film formation properties of oligomeric or polymeric hole conductor materials.

Below, the chemical structure of oligomeric crosslinkable hole conductors on triarylamine basis having oxetane as a reactive group is shown.

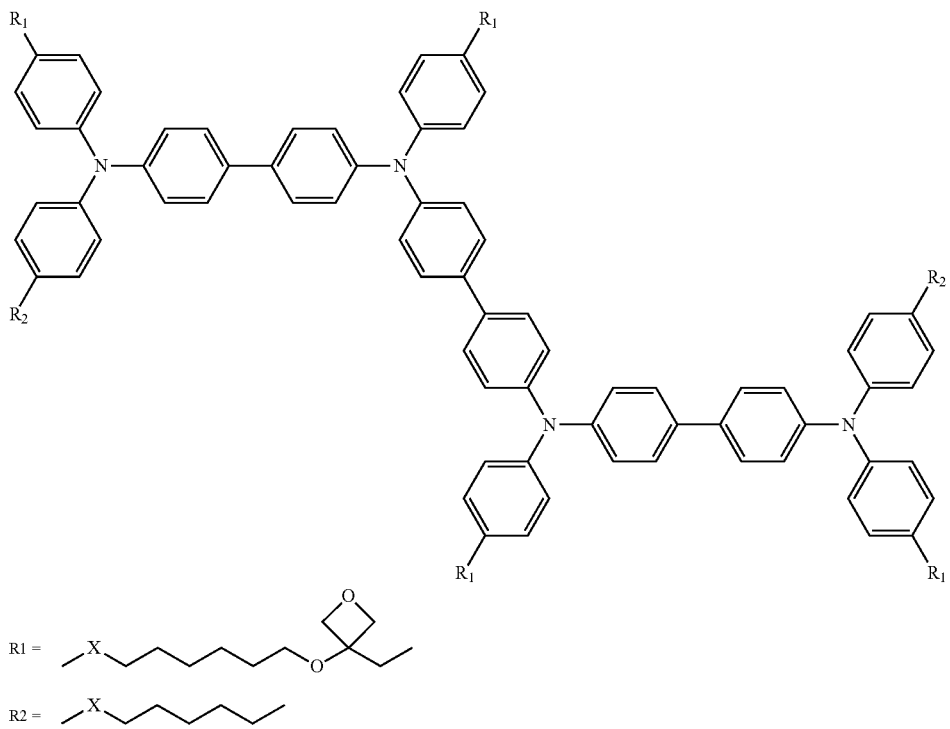

Below, the chemical structure of polymeric crosslinkable hole conductors on triarylamine basis having oxetane as a reactive group is shown.

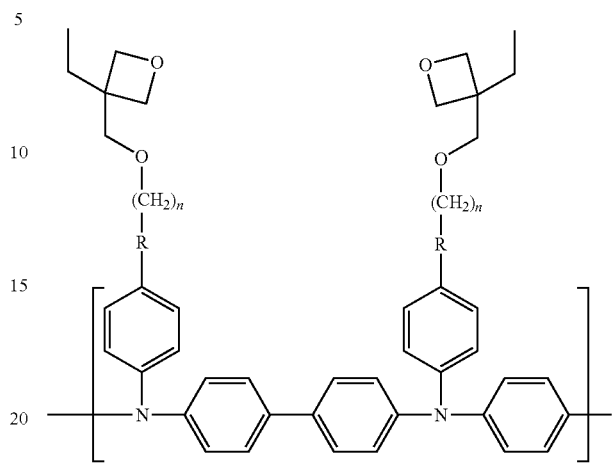

The present invention allows very precise adjustment of a desired color shade. The emitter layer which preferably generates white light, may consist of polymeres, oligomeres, small molecules, metal complexes, or a blend thereof.

An OLED design of in the present invention especially comprises several thin organic layers. On top of an anode which may be completely or partly transparent to light (e.g. indium-tin-oxide=ITO, silver, aluminum, gold, $MoO_3$, nickel, TIN) and which is located on a transparent substrate, for example on a glass plate or a transparent layer of synthetic material such as polyethylene terephthalate (PET), a hole transport layer (HTL) may be provided which may consist of crosslinkable materials and be of variable thickness. Depending on the manufacturing method an additional hole transport layer consisting of PEDOT/PSS (Poly(3,4-ethylenedioxythiophene)/poly-styrenesulfonate, Baytron P) may be provided between the anode and the hole transport layer, which is employed to lower the injection barrier for holes and furthermore smoothens the surface. On top of the hole transport layer a layer may be applied which either contains dyes emitting different colors (preferably approx. 0.05-10%, but lower or higher concentrations are also possible, such as for example 0.01 to 80%), for example a white-emitting copolymer, or consists of several separate layers emitting different colors. Suitable materials are known from the documents "J. Liu et al., Adv. Mater. 17, 2947-2978 (2005)" as well as "B. W. D'Andrade et al., Adv. Mater. 16, 624-628 (2004)".

This layer is the emitter layer (emitter layer=EL). It may for example be deposited from a solution or under full vacuum. An electron transport layer (electron transport layer=ETL) may be applied thereon. Finally, a cathode (consisting of a metal or an alloy having low electron work function (e.g. calcium, aluminum, magnesium/silver alloy) may be provided which, for example has been applied by vapor deposition under full vacuum. In order to decrease the injection barrier for electrons a very thin layer of, for example LiF or CsF may have been applied, for example by vapor deposition between the cathode and the ETL or the emitter. The cathode may finally be coated with silver or aluminum. However, the transparent substrate may also be adjacent to the cathode. Depending on the requirements the cathode or the anode is completely or partly transparent to light or completely reflective.

In an embodiment of the invention the OLED design comprises several thin organic layers. In particular, a non-transparent substrate (for example a silicon wafer or a metal sheet) will be used. Depending on the requirements a fully or partly reflective electrode (e.g. of ITO, silver, aluminum, gold, $MoO_3$, nickel, calcium, barium, LiF, CsF or TIN) is applied on this substrate. Depending on the requirements, this electrode may serve either as cathode or anode. In order to improve light reflection additional reflective layers (for example Bragg mirrors) may be added between the anode and the substrate. A second electrode which is completely or partly transparent (e.g. made of ITO, silver, aluminum, gold, $MoO_3$, nickel, calcium, barium, LiF, CsF or TIN) is applied on the organic layers. Depending on the requirements additional reflective layers (for example Bragg mirrors) may be applied on this electrode. In this embodiment the light is not emitted through the substrate but through the upper electrode (and, if applicable, through the additional reflective layers located on top).

The invention is based on the idea to provide a first and second mirror layer which at the same time can perform the function of electrodes in order to allow for the electrical component to be suitably controlled. A layer is positioned between the mirror layers which especially generates white light. A layer is positioned between the mirror layers which is provided in order to allow for suitable structuring. Additionally, further layers may be provided within or outside the lossy optical resonator. It is to be noted that there is a layer within the optical resonator that has been structured in only one process step. Finally, the desired layers may be applied in any order. It is for example possible to first apply the structured layer, then a layer which emits white light and, if desired, further functional layers which may for example be known from prior art.

Such a design allows for better utilization and creation of the possible color space. Thus, more brilliant colors are possible, not only in comparison to TFT or LCD technology but also in comparison to other OLED lighting components or OLED displays. In the case of a white light illumination a spectrum that appears more natural can be generated.

As known from the state of the art a substrate, for example a CMOS chip, may already comprise an electronic circuit which, in the case of a display, is used to suitably control the pixels. The structuring of the layer with the variable layer thicknesses must, in this case, be performed such that the respective layer thicknesses and pixels, respectively, are suitably aligned in relation to the electronics. Thus, in the case of a display, only one alignment step is necessary. The other alignment steps known from prior art and mentioned above will be omitted.

In one embodiment of the invention the structured layer of the light-emitting diode comprises not only three variable thicknesses in order to display three basic colors but substantially more variable thicknesses. In this case, a gray-scale mask used in the manufacturing process does not have only three shades of gray in order to provide three spectral colors but substantially more color levels, such as for example twenty shades. With so many different colors being emitted by the light-emitting diode substantially better results may be achieved when a desired light color is to be generated, for example for the simulation of sunlight.

For practical reasons, it has not been possible in prior art to provide such a multitude of shades as is required to generate perfect white light, i.e. light which ensures good color rendering properties. With the present invention this can be achieved in a fast and easy way as structuring can be provided in a one step process. According to the present invention it will therefore become possible to provide lighting devices which is able to simulate white light particularly well.

By requiring a layer which only generates white light the problem of undesired aging effects occurring due to inhomogeneous control is avoided. In this respect, there is an advantage in comparison to such prior art wherein pixels emitting different colors are actuated variably and for periods of times differing in lengths causing them to age at different rates.

In one embodiment of the invention the thickness of the structured layer increases and decreases, respectively, in a wedge-like shape. I.e. the distance between the two mirror surfaces of the resonator changes following the shape of a wedge. Such an organic light-emitting diode is capable of displaying the entire color spectrum, with the various spectral colors being resolved spatially arranged.

In one embodiment of the invention different areas of said wedge are contacted by different electrodes. This allows for separate addressing of the different spectral line components.

In one embodiment the light-emitting diode having wedge-shaped structure according to the present invention is part of a spectrometer, i.e. a component by which the spectral range of the light is displayed spatially adjacent to each other. The wedge-shaped structure allows for excellent reproduction of the entire spectral range. A wedge-shaped structure according to the invention continuously increases in thickness beginning at a minimal thickness $d_{min}$ until a maximum thickness $d_{max}$ of the structure is reached. A similar result can be achieved if, instead of a continuous increase, increase follows a staircase-like shape with the staircase comprising a large number of steps having low step height.

The lower the step height of each step the more the achieved result resembles a continuous increase. However, a continuous increase will be preferred, compared to a staircase-like shape of increase.

In one embodiment of the invention the light-emitting diode according to the invention comprises an increasing and/or decreasing structure within the lossy resonator and is used for illumination. The illumination emits several light colors which are spatially apart from each other.

A component which is capable of transmitting spectral colors in a spatially arranged manner may also be only approximately of wedge-like shape in the above-mentioned sense, for example of staircase-like shape. Generally such a component is suitable for manufacturing monochromatic integrated light sources for sensor technology.

BRIEF DESCRIPTION OF THE DRAWINGS

The present invention will be described in greater detail with reference to the accompanying drawings in which.

DESCRIPTION OF THE PREFERRED EMBODIMENTS

Figure 1:
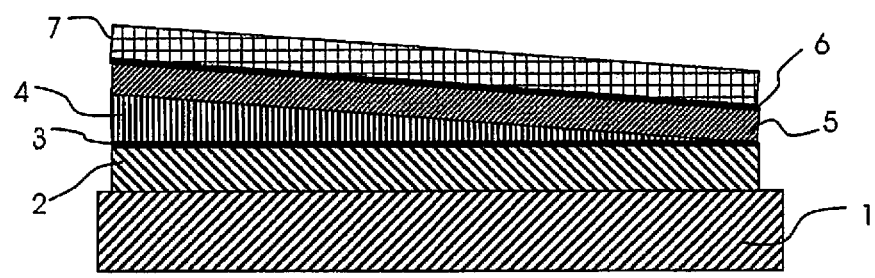
FIG. 1 illustrates a cross-sectional view of one embodiment according to the present invention.

FIG. 1 shows a design of one embodiment of the invention in cross section. On a silicon wafer 1 a mirror layer 2 of aluminum having a thickness of 100 nm is located, functioning as an electrode on the one hand, and as a mirror layer of an optical resonator on the other hand. A layer 3 of $MoO_3$ of a thickness of 10 nm is located on the mirror layer 2, as is a photochemically crosslinkable semiconductive layer 4 the thickness of which changes in the shape of a wedge. The thickest point of the wedge-like shaped layer 4 is 60 nm. The wedge-like shaped layer consists of N,N'-bis[4-(6-[(3-ethyloxetane-3-yl)methoxy]hexyloxi)-phenyl]-N,N'bis(4-methoxypenyl)biphenyl-4,4'-diamine, i.e. a structure on triarylamine basis having oxetane as a reactive group. An emitter layer 5 which is capable of emitting white light is deposited on the wedge-like shaped layer 4. The emitter layer consists of a white-emitting copolymer and has a thickness of 70 nm. An electron injecting layer 6 of barium of a thickness of 4 nm is located on the emitter layer 5, as is an additional mirror layer 7 which consists of silver and is 70 nm thick. The electrically conductive layer 7 is partly transparent, such that light is coupled out via this layer 7 from the optical resonator which comprises the two mirror layers 2 and 7.

The thicknesses of the separate layers and the thickness range of the wedge beginning at a minimal thickness $d_{min}=0$ and ending at a maximum thickness $d_{max}=60$ nm are selected such that a resonance for blue light is achieved at the thinnest point of the wedge and for red light at the thickest point. If another spectral range is to be covered said different thicknesses must be selected. Thus, a desired spectral range can be achieved by solely selecting the thicknesses.

Figure 2:
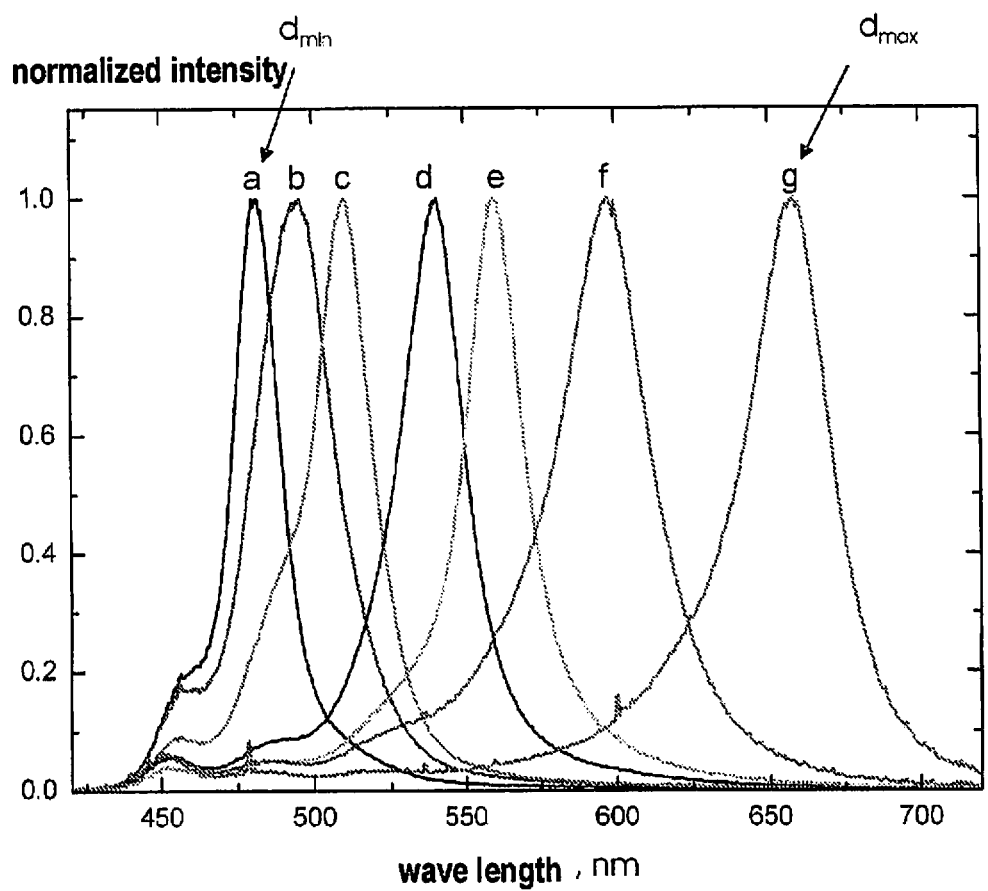
FIG. 2 Illustrates a graph of normalized intensity in relation to wavelength with the embodiment of FIG. 1.

With the light source shown in FIG. 1 the electroluminescence spectra a-g shown in FIG. 2 could be generated. FIG. 2 shows the normalized intensity in relation to wave length in nm. The separate light colors may for example be used to measure the transmission spectrum of a substance, liquid or solution, by suitably combining the OLED with a photodetector. The functionality of a spectrometer will thereby be achieved. However, the dimensions of the manufactured component were significantly smaller than the dimensions of a commercially available spectrometer. Such a measurement is not possible in prior art. On the one hand, OLEDs manufactured in prior art emit over too wide a range of the spectrum (for example white-emitting OLEDS, but also wideband red-, green- or blue-emitting OLEDs). On the other hand, it is not possible in prior art to generate various wavelengths, spatially dissolved and covering the entire visible range of light on one single substrate.

The mirror layers in the embodiment shown in FIG. 1 do not necessarily need to additionally function as electrodes. It is sufficient if the emitter layer is located between two layers functioning as electrodes. It is thus not mandatory that the layer the thickness of which changes in wedge-like shape will be located within the two electrodes. The same is true for other embodiments of the invention which comprise a layer with variable layer thicknesses. If the layer with a variable layer thickness and a wedge-like shaped structure, respectively, is located within the optical resonator but is not located between two electrodes the materials may be selected more freely, since it thus will be of no importance in how far the layer with variable layer thicknesses will be electrically conductive or not. Thus, this layer with variable layer thicknesses may accordingly be an optically transparent electrical isolator.

Figure 3:
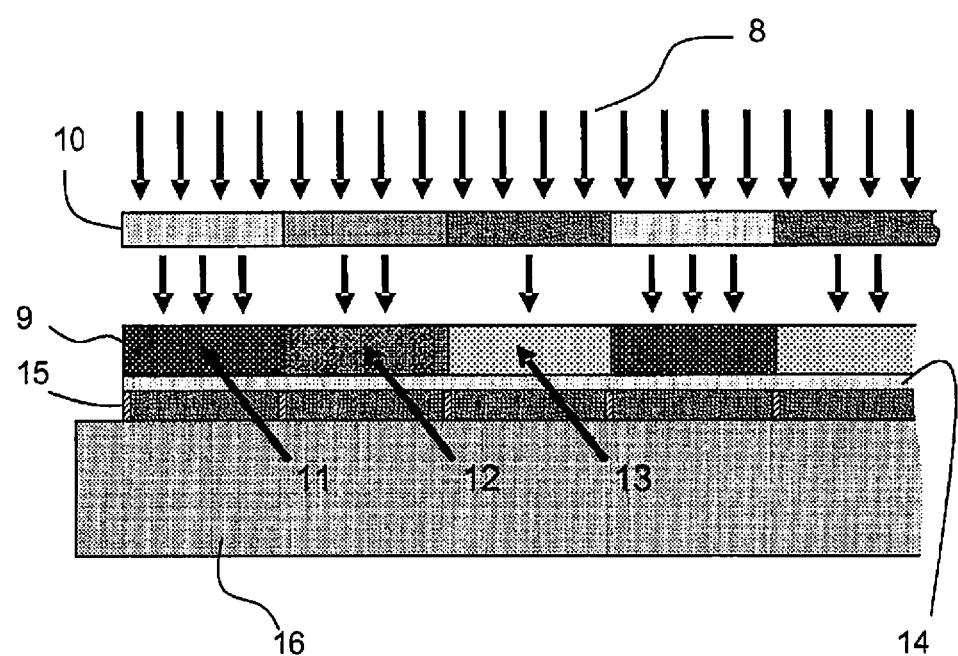
FIG. 3 schematically illustrates exposure of a crosslinkable semiconductor to light through a gray-scale mask.

FIG. 3 shows exposure 8 of a crosslinkable semiconductor 9 to light through a gray-scale mask 10. Variable exposures to light will lead to different degrees of crosslinking in areas 11, 12 and 13. The crosslinkable semiconductor, consisting for example of N,N'-bis(4-(6-((3-ethyloxetane-3-y)methoxyl))-hexylphenyl)-N,N'-diphenyl-4,4'-diamine or N,N'-bis[4-(6-[(3-ethyloxetane-3-yl)methoxy]hexyloxy)-phenyl]-N,N'-bis(4-methoxy-phenyl) biphenyl-4,4'-diamine, is located on a transparent oxide 14, such as, for example $MoO_3$. The transparent oxide is applied to a pixilated mirror 15 consisting of metal. The mirror 15 in turn is located on a substrate 16 which for example consists of silicon dioxide and/or silicon and may already comprise an electronic circuit by means of which the pixels are suitably controlled.

Figure 4:
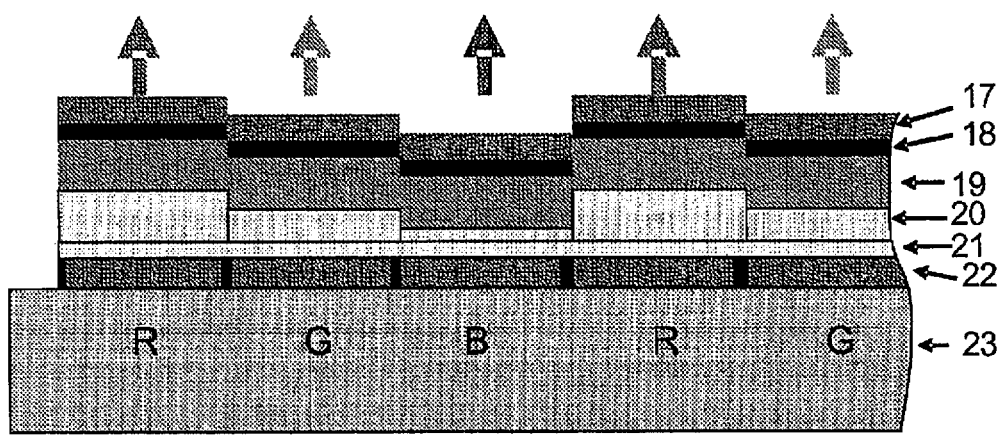
FIG. 4 schematically Illustrates cross-sectional image through a display according to the present invention.

FIG. 4 shows a schematic cross-sectional image through a display manufactured according to the present invention, having red (R), green (G) and blue (B) subpixels. The following layer design is shown:

17: Partly transparent metal mirror, e.g. Ag;
18: Electron injection layer, e.g. Ba;
19: Emitting layer
20: Crosslinked semiconductor;
21: Transparent oxide, e.g. $MoO_3$;
22: Pixilated metal mirror, e.g. Al;
23: Substrate.

Figure 5:
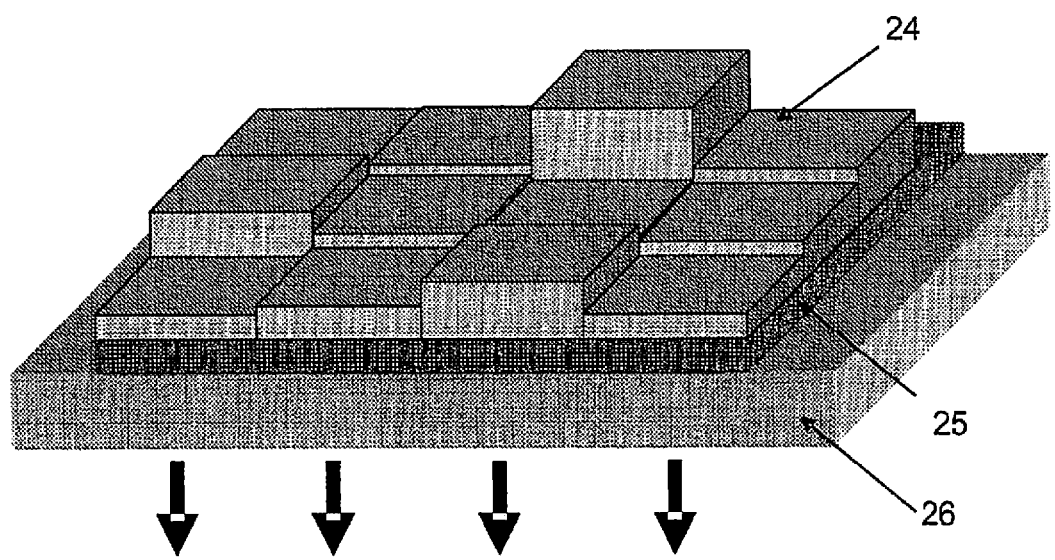
FIG. 5 schematically Illustrates design of a light source according to the present invention.

FIG. 5 shows a schematic design of a light source for illumination applications manufactured according to the present invention. The electrical component is shown before deposition of the emitter layer, the electron injection layer and the reflective cathode. Crosslinked hole conductor layers 24 of different thicknesses, a partly transparent metal mirror 25, e.g. consisting of Ag, and a transparent substrate 26 are shown.

Figure 6:
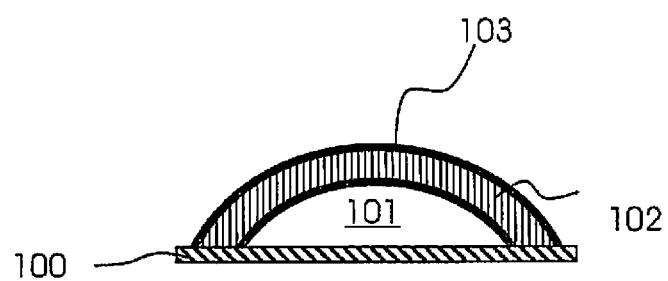
FIG. 6 illustrates an example of a lighting component emitting light spectrum in a spatially-separated manner.

FIG. 6 shows an example of a lighting component emitting the light spectrum in a spatially separated manner. On a mirror layer 100 an optically transparent hemispherical layer 101 is provided which thus increases as well as decreases continuously. On the hemispherical layer 101 a conventional OLED configuration 102 comprising two electrodes and an emitter layer lying between them is provided. Basically, the light originating from the emitter layer is reflected back and forth one or several times between mirror layer 100 and an oppositely located, i.e. exterior, partly reflecting layer 103 before the light escapes through layer 103. The layer 103 also functions as an electrode.

The invention claimed is:

1. An organic light-emitting diode having
a lossy optical resonator comprising two mirrors, a reflective mirror and a partially reflective and partially penetrable mirror such that a standing wave forms in the resonator and a light beam is able to escape after reflection, and
an emitter layer (5) within the optical resonator, which can generate light by recombination of electrons with holes, wherein
the organic light-emitting diode comprises an electron or hole conducting layer (4, 20, 24) which is located within the optical resonator and composed of a photolithographically structurable material located between the two mirrors,
the photolithographically structurable material is especially photochemically crosslinkable, or a photoresist which becomes soluble through exposure, and
thickness of said electron or hole conducting layer (4, 20, 24) changes.

2. The light-emitting diode according to claim 1 having an emitter layer (5, 19) that is designed such that it is capable of emitting white light.

3. The light-emitting diode according to claim 2 wherein the emitter layer is composed of a material having oxetane as a reactive group.

4. The light-emitting diode according to claim 1 wherein the emitter layer is an RGB copolymer, a blend of red, green and blue-emitting components or comprises a layer system comprising layers emitting red, green and blue.

5. The light-emitting diode according to claim 1 wherein completely or partly reflecting layers (2, 7) of the optical resonator consist of silver, aluminum or gold or are designed as Bragg mirrors.

6. The light-emitting diode according to claim 1, wherein the thickness of said electron or hole conducting layer (4) changes along a wedge-like or staircase-like shape.

7. The light-emitting diode especially according to claim 1, having a layer within the lossy optical resonator, wherein said layer comprises more than three different layer thicknesses, preferably at least six, most preferably ten different layer thicknesses.

8. A display having light-emitting diodes according to claim 1 comprising a layer comprising three different layer thicknesses.

9. A lighting device having light-emitting diodes claim 1, wherein the thickness of said electron or hole conducting layer (4) continuously increases and/or decreases.

10. A process of production of an organic light-emitting diode according to claim 1, comprising the steps of
depositing an electron or hole conducting layer (4, 20, 24) composed of photochemically crosslinkable material on top of a mirror layer (2) of a lossy optical resonator,
adjusting thickness of the electron or hole conducting layer (4, 20, 24) by a photolithographical process to vary the layer thickness,
depositing an emitter layer (5) on top of the electron or hole conducting layer (4, 20, 24), and
depositing a second mirror layer (7) of the lossy optical resonator on top of the emitter (5) and electron or hole conducting (4, 20, 24) layers.

11. The process according to claim 10 wherein the lithographical process is performed by locating a gray-scale mask on top of the photochemically crosslinkable material, exposing the photochemically crosslinkable material through the gray-scale mask and subsequently removing the non-crosslinked areas.

12. The light-emitting diode according to claim 3 wherein the emitter layer is an RGB copolymer, a blend of red, green and blue-emitting components or comprises a layer system comprising layers emitting red, green and blue.

13. The light-emitting diode according to claim 2 wherein the emitter layer is an RGB copolymer, a blend of red, green and blue-emitting components or comprises a layer system comprising layers emitting red, green and blue.

14. The light-emitting diode according to claim 1, wherein the thickness of said electron or hole conducting layer (4, 20, 24) gradually changes in wedge-like shape.

15. The light-emitting diode according to claim 1, comprising
a silicon wafer (1),
a first mirror layer (2) located on the wafer (1) and forming at least part of said reflective mirror,
an oxide layer (3) located on the first mirror layer (2),
the electron or hole conducting layer (4) of variable thickness located on the oxide layer (3),
the emitter layer (5) located on the electron or hole conducting layer (4),
an electron injecting layer (6) located on the emitting layer (5), and
a second mirror layer (7) located on the electron injecting layer (6) and forming at least part of said partially reflective and partially penetrable mirror.

16. The light-emitting diode according to claim 15, wherein the electron or hole conducting layer (4) gradually changes in wedge-like shape.

17. The light-emitting diode according to claim 1, comprising a single, continuous, electron or hole conducting layer (4, 20, 24) of varying thickness.

* * * * *